United States Patent
Wang et al.

(10) Patent No.: US 9,529,377 B2
(45) Date of Patent: Dec. 27, 2016

(54) ADAPTIVE VOLTAGE SCALING CIRCUIT AND CHIP

(71) Applicant: Huawei Technologies Co., Ltd., Shenzhen (CN)

(72) Inventors: Xinru Wang, Shanghai (CN); Xin Jin, Shanghai (CN); Yong He, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 11 days.

(21) Appl. No.: 14/732,373

(22) Filed: Jun. 5, 2015

(65) Prior Publication Data

US 2015/0362943 A1 Dec. 17, 2015

(30) Foreign Application Priority Data

Jun. 12, 2014 (CN) .......................... 2014 1 0259445

(51) Int. Cl.
| | |
|---|---|
| *G06F 1/00* | (2006.01) |
| *G05F 3/02* | (2006.01) |
| *G01R 31/30* | (2006.01) |
| *G06F 1/32* | (2006.01) |
| *H02M 3/157* | (2006.01) |
| *G01R 31/317* | (2006.01) |

(52) U.S. Cl.
CPC .............. *G05F 3/02* (2013.01); *G01R 31/3004* (2013.01); *G06F 1/3296* (2013.01); *H02M 3/157* (2013.01); *G01R 31/31721* (2013.01)

(58) Field of Classification Search
CPC . G05R 3/02; G01R 31/3004; G01R 31/31721; G06F 1/3296; H02M 3/157
USPC ............................................... 713/300
See application file for complete search history.

(56) References Cited

U.S. PATENT DOCUMENTS

| | | |
|---|---|---|
| 6,944,780 B1 | 9/2005 | Kranzen et al. |
| 6,985,025 B1 | 1/2006 | Maksimovic et al. |
| 7,024,568 B2 | 4/2006 | Maksimovic et al. |
| 7,581,120 B1 | 8/2009 | Hartman et al. |

(Continued)

FOREIGN PATENT DOCUMENTS

| | | |
|---|---|---|
| CN | 1643477 A | 7/2005 |
| CN | 1643480 A | 7/2005 |

(Continued)

*Primary Examiner* — Robert Cassity
(74) *Attorney, Agent, or Firm* — Leydig, Voit & Mayer, Ltd.

(57) ABSTRACT

The present invention discloses an adaptive voltage scaling circuit and a chip. The adaptive voltage scaling circuit includes a performance classification monitor and an adaptive controller, where the performance classification monitor is disposed inside the chip, and is configured to detect working performance of the chip at a current working voltage, and output a detection result signal to the adaptive controller; and the adaptive controller is connected to the performance classification monitor, and is configured to output a control signal to a power management module of the chip according to the detection result signal output by the performance classification monitor, where the control signal is used to control the power management module to adjust a working voltage of the chip. In embodiments of the present invention, test workload can be reduced.

20 Claims, 6 Drawing Sheets

(56) References Cited

U.S. PATENT DOCUMENTS

| | | | |
|---|---|---|---|
| 8,378,738 B1* | 2/2013 | Zhu | G06F 1/3296 |
| | | | 327/158 |
| 9,223,327 B1* | 12/2015 | Zhu | G06F 1/3203 |
| 2006/0190744 A1* | 8/2006 | Blanco | G06F 1/26 |
| | | | 713/300 |
| 2007/0247216 A1 | 10/2007 | Kolinummi et al. | |
| 2008/0106327 A1 | 5/2008 | Meijer et al. | |
| 2008/0186001 A1 | 8/2008 | Singh et al. | |
| 2010/0277158 A1 | 11/2010 | Lee et al. | |
| 2011/0004774 A1 | 1/2011 | Hansquine et al. | |
| 2011/0080202 A1* | 4/2011 | Moore | G06F 1/3203 |
| | | | 327/276 |
| 2011/0119513 A1 | 5/2011 | Krishnamurthy et al. | |
| 2012/0075005 A1 | 3/2012 | Flores et al. | |
| 2012/0293195 A1 | 11/2012 | Bourstein | |
| 2013/0321072 A1 | 12/2013 | Yao et al. | |
| 2015/0028931 A1 | 1/2015 | Xie et al. | |
| 2015/0362943 A1 | 12/2015 | Wang et al. | |

FOREIGN PATENT DOCUMENTS

| | | |
|---|---|---|
| CN | 1985232 A | 6/2007 |
| CN | 101006411 A | 7/2007 |
| CN | 101680920 A | 3/2010 |
| CN | 102473030 A | 5/2012 |
| CN | 102818983 A | 12/2012 |
| CN | 102879631 A | 1/2013 |
| CN | 103326714 A | 9/2013 |
| CN | 103345299 A | 10/2013 |
| CN | 103455077 A | 12/2013 |
| CN | 104035018 A | 9/2014 |
| WO | WO 2008115155 A1 | 9/2008 |

* cited by examiner

ADAPTIVE VOLTAGE SCALING CIRCUIT AND CHIP

CROSS-REFERENCE TO RELATED APPLICATIONS

This application claims priority to Chinese Patent Application No. 201410259445.1, filed on Jun. 12, 2014, which is hereby incorporated by reference in its entirety.

TECHNICAL FIELD

Embodiments of the present invention relate to the field of electronic technologies, and more specifically, to an adaptive voltage scaling circuit and a chip.

BACKGROUND

With the development of a chip manufacturing process and improvement in design integration, a problem of chip power consumption becomes an issue that needs to be solved urgently. Besides conventional technologies such as clock gating for reducing the chip power consumption, an adaptive voltage scaling (AVS, Adaptive Voltage Scaling) technology draws much attention as a new effective and important low power consumption technology. Determining a lowest working voltage of a chip is a core step for implementing the AVS technology, where the lowest working voltage needs to guarantee security at the worst working condition of a system. An actual working voltage of the chip may be obtained by adding a proper voltage margin on a basis of the lowest working voltage of the chip. In an AVS system implemented by using the foregoing method, an actual working voltage of the AVS system may reduce to 85% of a working voltage in a condition in which the AVS system is not used, and the power consumption may save up to 30%.

However, when determining the lowest working voltage of the chip, it is very difficult to construct a reasonable test vector, and it is often difficult to ensure that all the related paths are covered. At present, a common practice in the industry is using a design for test (Design For Test, DFT) vector to perform a test, and then determine the lowest working voltage of the chip. Then, comparison with an actual measurement result is made, and a value of the lowest working voltage is revised on this basis. The foregoing method requires a great number of chips for test, a heavy workload, and a time-consuming test procedure.

SUMMARY

Embodiments of the present invention provide an adaptive voltage scaling circuit and a chip, which may reduce test workload.

According to a first aspect, an adaptive voltage scaling circuit is provided, where the adaptive voltage scaling circuit includes a performance classification monitor and an adaptive controller, and the performance classification monitor is disposed inside a chip, and is configured to detect working performance of the chip at a current working voltage, and output a detection result signal to the adaptive controller; the adaptive controller is connected to the performance classification monitor, and is configured to output a control signal to a power management module of the chip according to the detection result signal output by the performance classification monitor, where the control signal is used to control the power management module to adjust a working voltage of the chip; the performance classification monitor includes a source signal generating circuit, a comparison reference circuit, at least one delay circuit, at least one comparison branch circuit, and at least one comparison detection circuit, where the source signal generating circuit is configured to provide a source signal for the performance classification monitor, the comparison reference circuit is configured to output a reference signal according to the source signal, the at least one delay circuit is configured to perform delay processing on the source signal to obtain a delayed source signal, the at least one comparison branch circuit is configured to output a comparison signal according to the delayed source signal, and the at least one comparison detection circuit is configured to output the detection result signal according to the reference signal and the comparison signal.

With reference to the first aspect, in a first implementation manner of the first aspect, the adaptive controller includes a configuration circuit and a control circuit, where the configuration circuit is configured to generate a configuration signal and output the configuration signal to the performance classification monitor, where the configuration signal is configured to set a delay chain of the performance classification monitor; and the control circuit is configured to output the control signal to the power management module of the chip according to the detection result signal output by the performance classification monitor.

With reference to the first aspect and the foregoing implementation manner, in a second implementation manner of the first aspect, the at least one delay circuit includes a first delay circuit and a second delay circuit, the at least one comparison branch circuit includes a first comparison branch circuit and a second comparison branch circuit, and the at least one comparison detection circuit includes a first comparison detection circuit and a second comparison detection circuit; an input end of the source signal generating circuit, a first input end of the comparison reference circuit, and a first input end of the first comparison branch circuit, and a first input end of the second comparison branch circuit separately receive a clock signal as a drive; the configuration signal includes a first configuration signal and a second configuration signal, where a first output end of the configuration circuit is connected to a first input end of the first delay circuit and provides the first configuration signal, and a second output end of the configuration circuit is connected to a first input end of the second delay circuit and provides the second configuration signal; an output end of the source signal generating circuit is configured to provide the source signal, and is separately connected to a second input end of the comparison reference circuit, a second input end of the first delay circuit, and a second input end of the second delay circuit; an output end of the first delay circuit is connected to a second input end of the first comparison branch circuit, and an output end of the second delay circuit is connected to a second input end of the second comparison branch circuit; an output end of the comparison reference circuit is configured to provide the reference signal, and is separately connected to a first input end of the first comparison detection circuit and a first input end of the second comparison detection circuit, an output end of the first comparison branch circuit is connected to a second input end of the first comparison circuit, and an output end of the second comparison branch circuit is connected to a second input end of the second comparison detection circuit; and an output end of the first comparison detection circuit and an output end of the second comparison detection circuit are separately connected to an input end of the control circuit, and are configured to provide the detection result signal.

With reference to the first aspect and the foregoing implementation manners, in a third implementation manner of the first aspect, the at least one delay circuit is a delay circuit, the at least one comparison branch circuit is a comparison branch circuit, and the at least one comparison detection circuit is a comparison detection circuit; an input end of the source signal generating circuit, a first input end of the comparison reference circuit, and a first input end of the comparison branch circuit separately receive a clock signal as a drive; the configuration signal includes a first configuration signal, and a first output end of the configuration circuit is connected to a first input end of the delay circuit and provides the first configuration signal; an output end of the source signal generating circuit is configured to provide the source signal, and is separately connected to a second input end of the comparison reference circuit and a second input end of the delay circuit; an output end of the delay circuit is connected to a second input end of the comparison branch circuit; an output end of the comparison reference circuit is configured to provide the reference signal, and is connected to a first input end of the comparison detection circuit, and an output end of the comparison branch circuit is connected to a second input end of the comparison detection circuit; and an output end of the comparison detection circuit is connected to an input end of the control circuit, and is configured to provide the detection result signal.

With reference to the first aspect and the foregoing implementation manners, in a fourth implementation manner of the first aspect, there are multiple performance classification monitors, and the performance classification monitors are evenly disposed inside the chip.

With reference to the first aspect and the foregoing implementation manners, in a fifth implementation manner of the first aspect, the comparison detection circuit includes an exclusive OR gate logic circuit.

With reference to the first aspect and the foregoing implementation manners, in a sixth implementation manner of the first aspect, the source signal generating circuit includes a flip-flop.

With reference to the first aspect and the foregoing implementation manners, in a seventh implementation manner of the first aspect, the comparison reference circuit includes a flip-flop.

With reference to the first aspect and the foregoing implementation manners, in an eighth implementation manner of the first aspect, the at least one comparison branch circuit includes a flip-flop.

With reference to the first aspect and the foregoing implementation manners, in a ninth implementation manner of the first aspect, the working performance of the chip at the current working voltage includes: the current working voltage being excessively high, the current working voltage being excessively low, or the current working voltage suitable for normal working.

According to a second aspect, a chip is provided, where the chip includes any one of the foregoing adaptive voltage scaling circuits.

Based on the foregoing technical solutions, in the embodiments of the present invention, the performance classification monitor is disposed inside the chip, so as to detect the working performance of the chip at different working voltages in real time. Then, the adaptive controller adjusts the working voltage of the chip according to a detection result output by the performance classification monitor. In this way, the working voltage of the chip may be automatically adjusted, so as to control the chip to work at a relatively low voltage under a premise of meeting a working performance requirement, thereby reducing chip power consumption.

Further, according to the embodiments of the present invention, the working performance of the chip is detected by the performance classification monitor disposed inside the chip to determine the working voltage of the chip, instead of performing determining by testing a great number of chips, thereby reducing workload and omitting a time-consuming test procedure.

BRIEF DESCRIPTION OF DRAWINGS

To describe the technical solutions in the embodiments of the present invention more clearly, the following briefly introduces the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are a part rather than all of the embodiments of the present invention. All other embodiments obtained by a person of ordinary skill in the art based on the embodiments of the present invention without creative efforts shall fall within the protection scope of the present invention.

Figure 1:
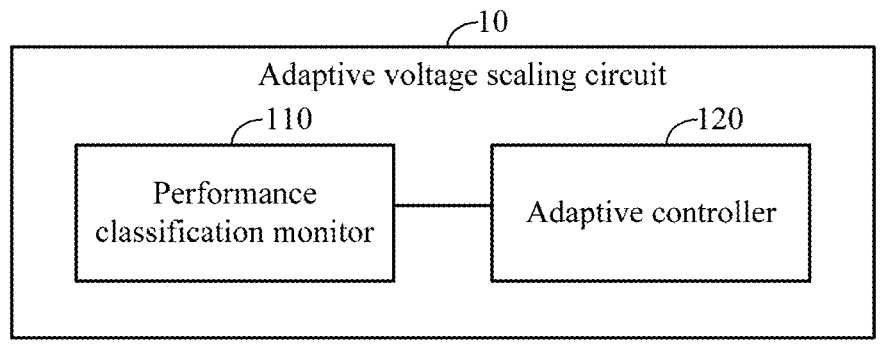
FIG. 1 is a schematic block diagram of an adaptive voltage scaling circuit according to an embodiment of the present invention.

FIG. 1 is a schematic block diagram of an adaptive voltage scaling circuit according to an embodiment of the present invention. As shown in FIG. 1, an adaptive voltage scaling circuit 10 includes a performance classification monitor 110 and an adaptive controller 120.

The performance classification monitor 110 is disposed inside a chip, and is configured to detect working performance of the chip at a current working voltage, and output a detection result signal to the adaptive controller.

For example, the working performance reflects at least one of the following: whether working of the chip at the current working voltage meets a preset requirement (that is, whether the current working voltage is excessively low), whether the current working voltage is excessively high, or whether the current working voltage is suitable for working of the chip, that is, the current working voltage is not excessively high or excessively low, and can be suitable for normal working.

The adaptive controller 120 is connected to the performance classification monitor, and is configured to output a control signal to a power management module of the chip according to the detection result signal output by the performance classification monitor, where the control signal is used to control the power management module to adjust a working voltage of the chip.

Figure 2:
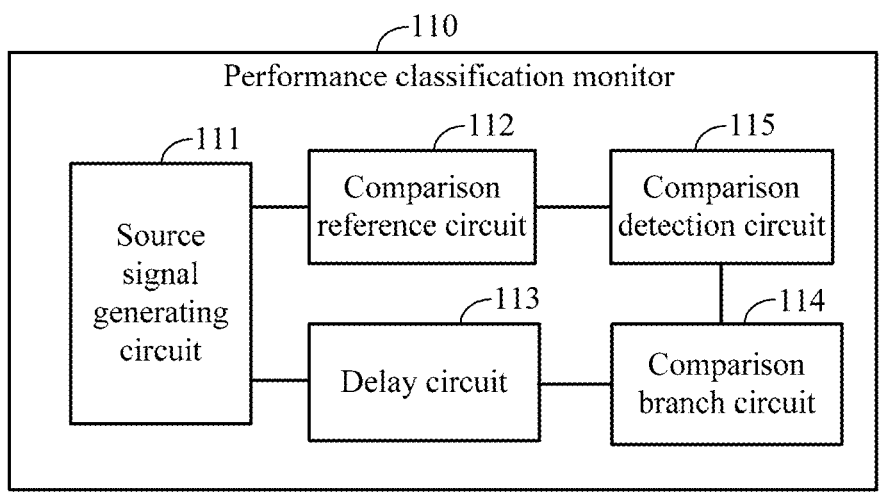
FIG. 2 is a schematic block diagram of a performance classification monitor according to an embodiment of the present invention.

FIG. 2 is a schematic block diagram of a performance classification monitor according to an embodiment of the present invention. As shown in FIG. 2, a performance classification monitor 110 includes a source signal generating circuit 111, a comparison reference circuit 112, at least one delay circuit 113, at least one comparison branch circuit 114, and at least one comparison detection circuit 115.

The source signal generating circuit 111 is configured to provide a source signal for the performance classification monitor.

The comparison reference circuit 112 is configured to output a reference signal according to the source signal.

The at least one delay circuit 113 is configured to perform delay processing on the source signal to obtain a delayed source signal.

The at least one comparison branch circuit 114 is configured to output a comparison signal according to the delayed source signal.

The at least one comparison detection circuit 115 is configured to output a detection result signal according to the reference signal and the comparison signal.

Based on the foregoing technical solution, in the embodiment of the present invention, the performance classification monitor is disposed inside a chip, so as to detect working performance of the chip at different working voltages in real time. Then, the adaptive controller adjusts a working voltage of the chip according to a detection result output by the performance classification monitor. In this way, the working voltage of the chip may be automatically adjusted, so as to control the chip to work at a relatively low voltage under a premise of meeting a working performance requirement, thereby reducing chip power consumption.

Further, according to the embodiment of the present invention, the working performance of the chip is detected by the performance classification monitor disposed inside the chip to determine the working voltage of the chip, instead of performing determining by testing a great number of chips, thereby reducing workload and omitting a time-consuming test procedure.

It should be understood that a position of the adaptive controller is not limited in the embodiment of the present invention. For example, the adaptive controller may be disposed inside the chip, or may be disposed outside the chip.

It should also be understood that when the performance classification monitor detects the working performance of the chip at a current working voltage, a detection result may also be affected by a current temperature of the chip. In other words, the detection result signal can better reflect an individual difference of each chip. In this way, when the working voltage of the chip is adjusted according to the detection result signal, higher accuracy and adjustment efficiency are achieved.

Figure 3:
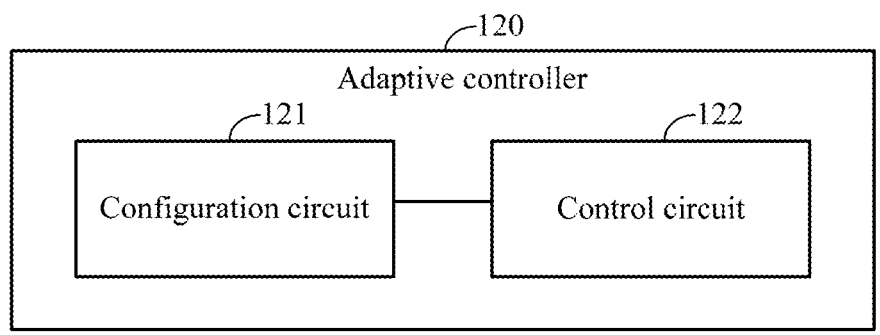
FIG. 3 is a schematic block diagram of an adaptive controller according to an embodiment of the present invention.

FIG. 3 is a schematic block diagram of an adaptive controller according to an embodiment of the present invention.

Optionally, as another embodiment, an adaptive controller 120 includes a configuration circuit 121 and a control circuit 122.

The configuration circuit 121 is configured to generate a configuration signal and output the configuration signal to a performance classification monitor, where the configuration signal is configured to set a delay chain of the performance classification monitor. The delay chain, under an effect of the configuration signal, enables the detection result signal to track working performance of the chip at a current working voltage.

The control circuit 122 is configured to output a control signal to a power management module of the chip according to the detection result signal output by the performance classification monitor.

For example, the configuration circuit 121 is connected to a delay circuit 113 in a performance classification monitor 110, and outputs a configuration signal to the delay circuit 113, so as to configure a delay chain of the delay circuit. The control circuit 122 is connected to a comparison detection circuit 115 in the performance classification monitor 110, and outputs a control signal to the power management module of the chip according to a detection result signal output by the comparison detection circuit 115, so as to control a working voltage of the chip.

Figure 4:
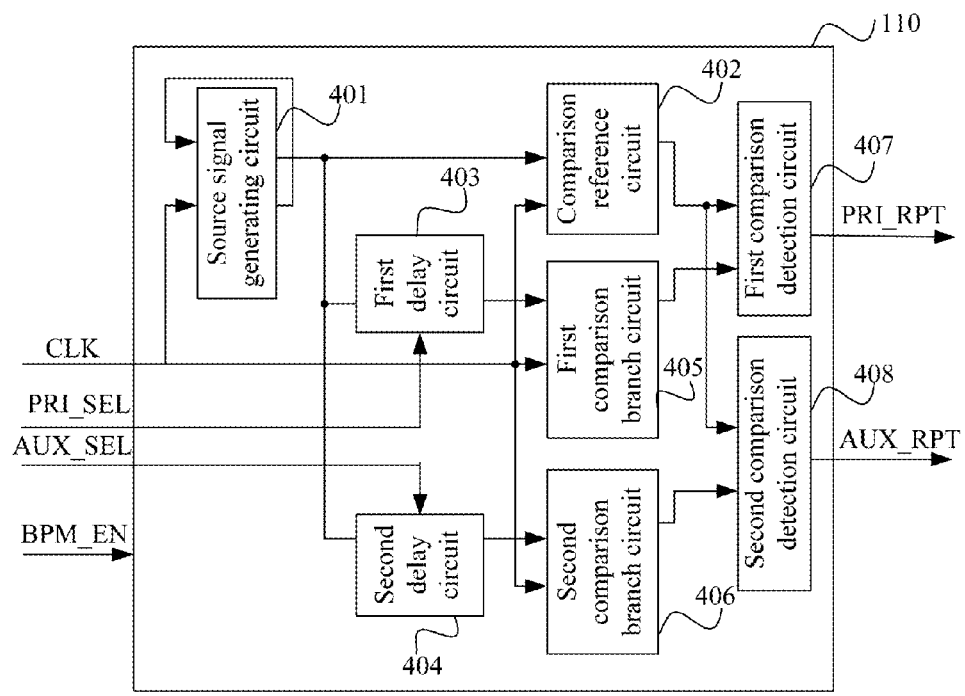
FIG. 4 is a schematic block diagram of a performance classification monitor according to another embodiment of the present invention.

FIG. 4 is a schematic block diagram of a performance classification monitor according to another embodiment of the present invention.

As shown in FIG. 4, optionally, as another embodiment, at least one delay circuit includes a first delay circuit 403 and a second delay circuit 404, at least one comparison branch circuit includes a first comparison branch circuit 405 and a second comparison branch circuit 406, and at least one comparison detection circuit includes a first comparison detection circuit 407 and a second comparison detection circuit 408.

An input end of a source signal generating circuit 401, a first input end of a comparison reference circuit 402, a first input end of the first comparison branch circuit 405, and a first input end of the second comparison branch circuit 406 separately receive a clock signal CLK as a drive.

A configuration signal includes a first configuration signal PRI_SEL and a second configuration signal AUX_SEL, where a first output end of a configuration circuit is connected to a first input end of the first delay circuit 403 and provides the first configuration signal PRI_SEL, and a second output end of the configuration circuit is connected to a first input end of the second delay circuit 404 and provides the second configuration signal AUX_SEL.

An output end of the source signal generating circuit 401 is configured to provide a source signal, and is separately connected to a second input end of the comparison reference circuit 402, a second input end of the first delay circuit 403, and a second input end of the second delay circuit 404.

An output end of the first delay circuit 403 is connected to a second input end of the first comparison branch circuit 405, and an output end of the second delay circuit 404 is connected to a second input end of the second comparison branch circuit 406.

An output end of the comparison reference circuit 402 is configured to provide a reference signal, and is separately connected to a first input end of the first comparison detection circuit 407 and a first input end of the second comparison detection circuit 408, an output end of the first comparison branch circuit 405 is connected to a second input end of the first comparison detection circuit 407, and an output end of the second comparison branch circuit 406 is connected to a second input end of the second comparison detection circuit 408.

An output end of the first comparison detection circuit 407 and an output end of the second comparison detection circuit 408 are separately connected to an input end of a control circuit, and are configured to provide a detection result signal.

A BPM-EN signal is an enabling signal.

A first output end of a configuration circuit 121 outputs a PRI_SEL signal to the first delay circuit 403, so as to configure a delay chain of the first delay circuit 403. A second output end of the configuration circuit 121 outputs an AUX_SEL signal to the second delay circuit 404, so as to configure a delay chain of the second delay circuit 404. Specifically, the first configuration signal PRI_SEL and the second configuration signal AUX_SEL may be determined by checking a static time sequence when a chip is taped out, analyzing an internal resistance drop IRDrop of the chip, and combining aging characteristics of a chip technology and other data. In this way, the first configuration signal PRI_SEL and the second configuration signal AUX_SEL form a window, so as to detect whether working performance of the chip at a current working voltage encounters an exception, for example, the voltage being normal, or the voltage being excessively low or excessively high.

The first configuration signal PRI_SEL corresponds to a detection result signal PRI_RPT, and the second configuration signal AUX_SEL corresponds to a detection result signal AUX_RPT. For example, meanings represented by the detection result signals are shown in Table 1.

in a memory. The configuration circuit 121 obtains, by searching the value table in the memory, a corrected value that is obtained after the original AUX_SEL value or PRI_SEL value that is configured unreasonably is corrected, and sends the corrected value as a new AUX_SEL value or PRI_SEL value to the performance classification monitor 110.

In another implementation manner, the configuration circuit 121 is configured by a person skilled in the art, so that the configuration circuit 121 obtains an AUX_SEL value or PRI_SEL value in response to the configuration of the person skilled in the art, and sends the AUX_SEL value or PRI_SEL value to the performance classification monitor 110, so as to effectively control a delay circuit 113 in the performance classification monitor 110. The person skilled in the art may specifically configure the configuration circuit 121 according to experience or a real chip test result, so that the configuration circuit 121 generates an appropriate AUX_SEL value or PRI_SEL value. After the AUX_SEL value or PRI_SEL value changes, a correspondence between the working performance and the detection result signal PRI_RPT and/or AUX_RPT also changes. That is, the configuration signal is configured to adjust the detection result signal of the performance classification monitor, so that the detection result signal accurately reflects or tracks the working performance of the chip at the current working voltage, and a probability of errors (which cannot accurately reflect the performance of the chip at the current voltage) in the detection result signal is reduced. For example, when PRI_RPT and AUX_RPT indicate normal voltage working performance; however, actually the current working voltage cannot meet a preset requirement, the person (operation personnel) skilled in the art needs to change the AUX_SEL value or the PRI_SEL value by configuring the configuration circuit 121, so as to change performance of the delay circuit 113, so that when PRI_RPT and AUX_RPT indicate normal

TABLE 1

| Chip working state | PRI_RPT | AUX_RPT | Explanation |
| --- | --- | --- | --- |
| Normal voltage | 0 | 1 | A high AUX_RPT output represents a relatively large circuit delay, and a low PRI_RPT output represents a normal circuit delay, and in this case, a power supply voltage is maintained. |
| Excessively high voltage | 0 | 0 | A low AUX_RPT output represents a normal circuit delay, and a low PRI_RPT output represents a normal circuit delay, and in this case, a power supply voltage may be decreased. |
| Excessively low voltage | 1 | 1 | A high AUX_RPT output represents a relatively large circuit delay, and a high PRI_RPT output represents a relatively large circuit delay, and in this case, a power supply voltage needs to be increased. |
| Abnormal configuration | 1 | 0 | A low AUX_RPT output represents a normal circuit delay, and a high PRI_RPT output represents a relatively large circuit delay, indicating that an AUX_SEL configuration causes the comparison branch circuit 406 to enter a sub-stable state at the voltage and a power supply voltage needs to be increased, and that the AUX_SEL configuration is not reasonable enough. |

In this way, a control circuit 122 outputs a control signal to a power management module of the chip according to the detection result signals AUX_RPT and PRI_RPT, so as to increase or decrease a working voltage of the chip.

When an AUX_SEL configuration is not reasonable, the configuration circuit 121 needs to reconfigure AUX_SEL (or reconfigure a value of PRI_SEL at the same time). Specifically, the configuration circuit 121 may search a preset value table by using an original AUX_SEL value or PRI_SEL value that is configured unreasonably, and correct a value of AUX_SEL or PRI_SEL. The value table may be prestored voltage working performance, the current voltage of the chip can meet a requirement indeed. Alternatively, when PRI_RPT and AUX_RPT indicate normal voltage working performance; however, actually the current working voltage is excessively high, and extra electricity is consumed, the person skilled in the art (operation personnel) needs to change the AUX_SEL value or the PRI_SEL value by configuring the configuration circuit 121, so as to change performance of the delay circuit 113, so that when the PRI_RPT and the AUX_RPT indicate normal voltage working performance, the current voltage of the chip returns to a reasonable level, and an over design does not exist.

In the embodiment of the present invention, a responding speed of the performance classification monitor is fast, and monitoring accuracy is not affected.

Figure 5:
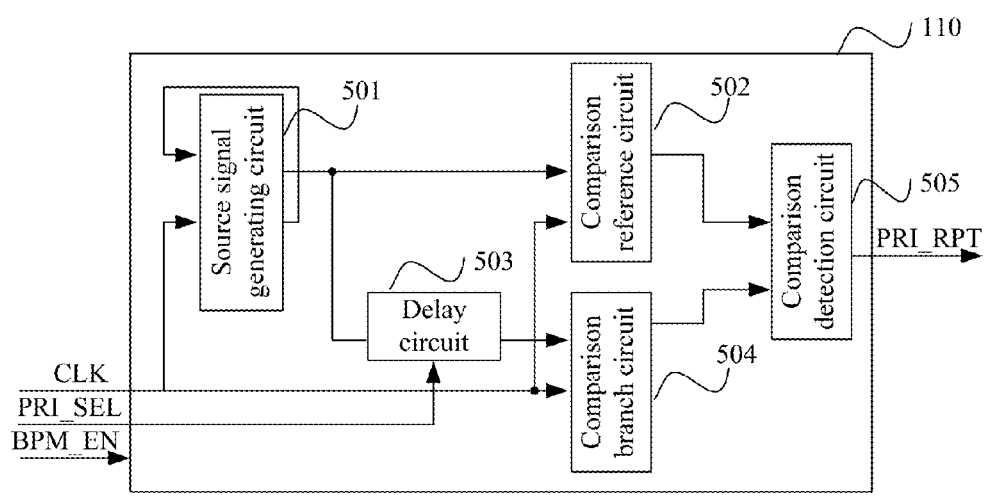
FIG. 5 is a schematic block diagram of a performance classification monitor according to another embodiment of the present invention.

FIG. 5 is a schematic block diagram of a performance classification monitor according to another embodiment of the present invention.

As shown in FIG. 5, optionally, as another embodiment, at least one delay circuit is a delay circuit 503, at least one comparison branch circuit is a comparison branch circuit 504, and at least one comparison detection circuit is a comparison detection circuit 505.

An input end of a source signal generating circuit 501, a first input end of a comparison reference circuit 502, and a first input end of the comparison branch circuit 504 separately receive a clock signal CLK as a drive.

A configuration signal includes a first configuration signal PRI_SEL, and a first output end of a configuration circuit is connected to a first input end of the delay circuit 503 and provides the first configuration signal PRI_SEL.

An output end of the source signal generating circuit 501 is configured to provide a source signal, and is separately connected to a second input end of the comparison reference circuit 502 and a second input end of the delay circuit 503.

An output end of the delay circuit 503 is connected to a second input end of the comparison branch circuit 504.

An output end of the comparison reference circuit 502 is configured to provide a reference signal, and is connected to a first input end of the comparison detection circuit 505, and an output end of the comparison branch circuit 504 is connected to a second input end of the comparison detection circuit 505.

An output end of the comparison detection circuit 505 is connected to an input end of a control circuit, and is configured to provide a detection result signal.

A BPM-EN signal is an enabling signal. An output end of a configuration circuit 121 outputs a PRI_SEL signal to the delay circuit 503, so as to configure a delay chain of the delay circuit 503. Specifically, the configuration signal PRI_SEL may be determined by checking a static time sequence when a chip is taped out, analyzing an internal resistance drop IRDrop of the chip, and combining aging characteristics of a chip technology and other data.

The comparison detection circuit 505 outputs a detection result signal PRI_RPT. For example, a low detection result signal PRI_RPT output represents a normal circuit delay, and a power supply voltage is maintained. A high PRI_RPT output represents a relatively large circuit delay, and a power supply voltage needs to be increased. In this case, the control circuit 122 outputs a control signal to a power management module of the chip according to the detection result signal PRI_RPT, so as to increase a working voltage of the chip.

Optionally, as another embodiment, there are multiple performance classification monitors 110, which are evenly disposed inside the chip.

In this way, a working performance of the chip at a current working voltage may be detected more accurately, thereby further improving accuracy and effectiveness of adaptive voltage control.

Optionally, as another embodiment, the comparison detection circuit includes an exclusive OR gate logic circuit.

It should be understood that the exclusive OR gate logic circuit constructed by using an AND gate and a NOT gate, or other equivalent exchange forms shall fall within the protection scope of the embodiment of the present invention.

Optionally, as another embodiment, the source signal generating circuit includes a flip-flop, the comparison reference circuit includes a flip-flop, and the at least one comparison branch circuit includes a flip-flop.

Optionally, as another embodiment, the working performance of the chip at the current working voltage includes: the current working voltage being excessively high, the current working voltage being excessively low, or the current voltage suitable for normal working.

Figure 6:
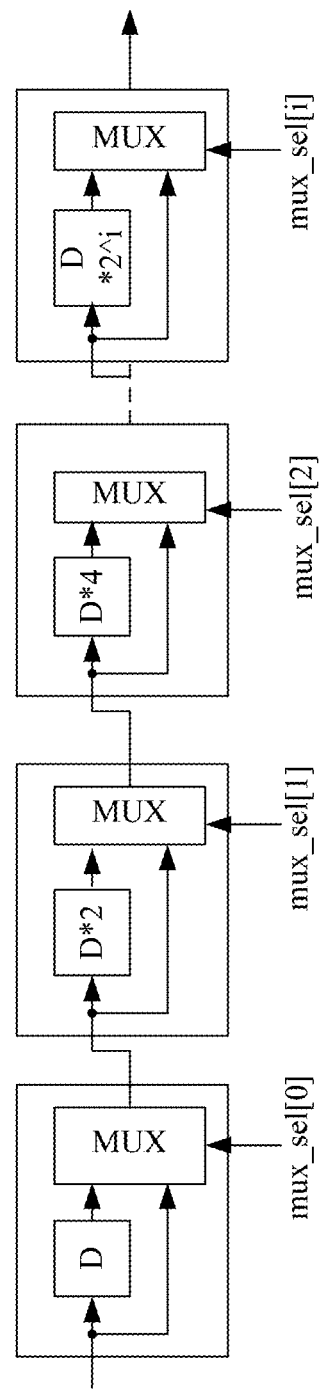
FIG. 6 is a schematic block diagram of a delay circuit according to an embodiment of the present invention.

FIG. 6 is a schematic block diagram of a delay circuit according to an embodiment of the present invention.

As shown in FIG. 6, the delay circuit performs selection on a delay path or a direct path by using a 2:1 switch MUX. There are $2^i$ (i is a binary code bit) standard delay units D on each level of delay path, and is represented as $D*2^i$. For example, if the delay circuit supports a maximum of 63 levels of standard delay units, there is 1 standard delay unit on a delay path at the 0th level of MUX, there are 2 standard delay units on a delay path at the 1st level of MUX, there are 4 standard delay units on a delay path at the 2nd level of MUX, there are 8 standard delay units on a delay path at the 3rd level of MUX, there are 16 standard delay units on a delay path at the 4th level of MUX delay path, there are 32 standard delay units on a delay path at the 5th level of MUX delay path, and so on, where a mux-sel[i] signal is used to control on and off of the ith 2:1 switch MUX.

The foregoing implementation manner has advantages such as using a small quantity of MUX units, and not requiring a decoding operation. For example, if 25 standard delay units are required, and a code is 011001, only delay paths at the 0th/3rd/4th level of MUX need to be selected.

Figure 7:
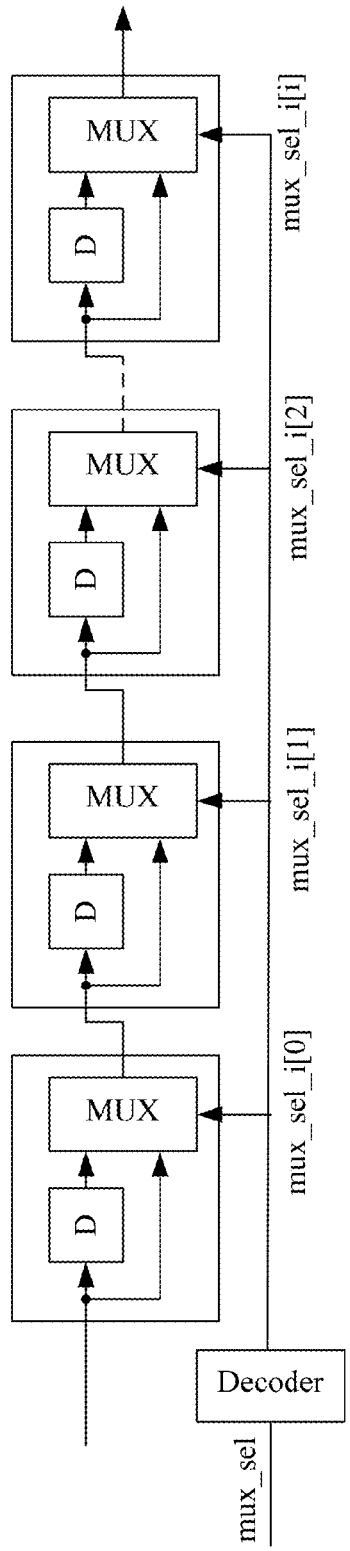
FIG. 7 is a schematic block diagram of a delay circuit according to another embodiment of the present invention.

FIG. 7 is a schematic block diagram of a delay circuit according to another embodiment of the present invention.

As shown in FIG. 7, the delay circuit performs selection on a delay path or a direct path by using a 2:1 switch MUX. There is a standard delay unit D at each level of delay path. A decoder first performs decoding on a required delay range mux-sel, and correspondingly generates a signal mux-sel[i] for controlling the MUX switch, where the mux-sel[i] signal is used to control on and off of the ith 2:1 switch MUX.

Figure 8:
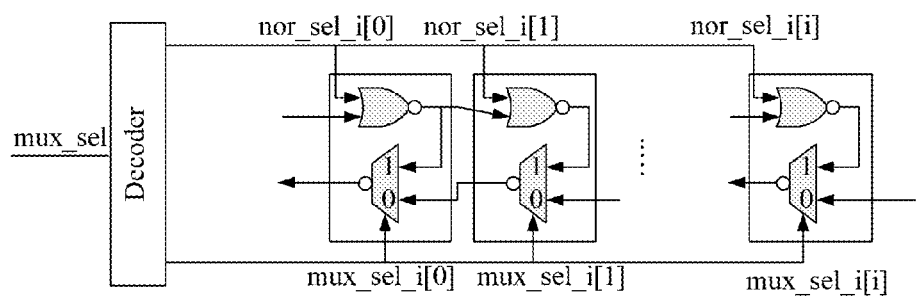
FIG. 8 is a schematic block diagram of a delay circuit according to another embodiment of the present invention.

FIG. 8 is a schematic block diagram of a delay circuit according to another embodiment of the present invention.

As shown in FIG. 8, the delay circuit performs selection on a delay path or a direct path by using a 2:1 switch MUX. There is a NAND gate logic unit at each level of delay path. The decoder first performs decoding on a required delay range mux-sel, and correspondingly generates a signal nor-sel[i] for controlling the NAND gate and a signal mux-sel[i] for controlling the 2:1 switch.

An embodiment of the present invention further provides a chip, where the chip includes any one of the foregoing adaptive voltage scaling circuits, or the chip includes any one of the foregoing performance classification monitors.

In the several embodiments provided in the present application, it should be understood that the disclosed system, apparatus, and method may be implemented in other manners. For example, the described apparatus embodiment is merely exemplary. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented through some interfaces. The indirect couplings or communication connections between the apparatuses or units may be implemented in electronic, mechanical, or other forms.

The units described as separate parts may or may not be physically separate, and parts displayed as units may or may not be physical units, may be located in a position, or may be distributed on a plurality of network units. A part or all of the units may be selected according to actual needs to achieve the objectives of the solutions of the embodiments of the present invention.

In addition, functional units in the embodiments of the present invention may be integrated into a processing unit, or each of the units may exist alone physically, or two or more units are integrated into one unit. The integrated unit may be implemented in a form of hardware, or may be implemented in a form of a software functional unit.

The foregoing descriptions are merely specific embodiments of the present invention, but are not intended to limit the protection scope of the present invention. Any modification or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. An adaptive voltage scaling circuit comprising:
   a performance classification monitor disposed inside a chip and configured to detect working performance of the chip at a current working voltage; and
   an adaptive controller for receiving a detection result signal from the performance classification monitor;
   wherein the performance classification monitor comprises a source signal generating circuit, a comparison reference circuit, at least first and second delay circuits, at least first and second comparison branch circuits and at least first and second comparison detection circuits; and the adaptive controller comprises a configuration circuit;
   wherein an input end of the source signal generating circuit and first input ends of the comparison reference circuit, the first comparison branch circuit and the second comparison branch circuit each receives a clock signal as a drive;
   a first output end of the configuration circuit provides a first configuration signal connected to a first input end of the first delay circuit;
   a second output end of the configuration circuit provides a second configuration signal connected to a first input end of the second delay circuit;
   an output end of the source signal generating circuit configured to provide a source signal and connected to second input ends of the comparison reference circuit and the first and second delay circuits;
   an output end of the first delay circuit connected to a second input end of the first comparison branch circuit;
   an output end of the second delay circuit connected to a second input end of the second comparison branch circuit;
   an output end of the comparison reference circuit configured to provide a reference signal and connected to each of first input ends of the first comparison detection circuit and the second comparison detection circuit;
   an output end of the first comparison branch circuit connected to a second input end of the first comparison detection circuit, and
   an output end of the second comparison branch circuit connected to a second input end of the second comparison detection circuit; and
   each of an output ends of the first comparison detection circuit and the second comparison detection circuit connected to an input end of the control circuit and configured to provide the detection result signal.

2. The adaptive voltage scaling circuit according to claim 1, wherein
   the adaptive controller is connected to the performance classification monitor, and is configured to output a control signal to a power management module of the chip according to the detection result signal output by the performance classification monitor, wherein the control signal is used to control the power management module to adjust a working voltage of the chip; and
   the source signal generating circuit is configured to provide the source signal for the performance classification monitor;
   the comparison reference circuit is configured to output the reference signal according to the source signal;
   the at least one delay circuit is configured to perform delay processing on the source signal to obtain a delayed source signal;
   the at least one comparison branch circuit is configured to output a comparison signal according to the delayed source signal; and
   the at least one comparison detection circuit is configured to output the detection result signal according to the reference signal and the comparison signal.

3. The adaptive voltage scaling circuit according to claim 2, wherein the adaptive controller further comprises a control circuit, wherein
   the configuration circuit is configured to generate the first configuration signal and the second configuration signal, wherein the first configuration signal and the second configuration signal are configured to set a delay chain of the performance classification monitor; and
   the control circuit is configured to output the control signal to the power management module of the chip according to the detection result signal output by the performance classification monitor.

4. The adaptive voltage scaling circuit according to claim 3, wherein the at least one delay circuit is a delay circuit, the at least one comparison branch circuit is a comparison branch circuit, and the at least one comparison detection circuit is a comparison detection circuit, wherein
   an input end of the source signal generating circuit, a first input end of the comparison reference circuit, and a first input end of the comparison branch circuit separately receive a clock signal as a drive;
   the configuration signal comprises a first configuration signal, and a first output end of the configuration circuit is connected to a first input end of the delay circuit and provides the first configuration signal;
   an output end of the source signal generating circuit is configured to provide the source signal, and is separately connected to a second input end of the comparison reference circuit and a second input end of the delay circuit;
   an output end of the delay circuit is connected to a second input end of the comparison branch circuit;
   an output end of the comparison reference circuit is configured to provide the reference signal, and is connected to a first input end of the comparison detection circuit, and an output end of the comparison branch circuit is connected to a second input end of the comparison detection circuit; and an output end of the comparison detection circuit is connected to an input end of the control circuit, and is configured to provide the detection result signal.

5. The adaptive voltage scaling circuit according to claim 1 further comprising the performance classification monitor among a plurality of performance classification monitors, and the plurality of performance classification monitors are evenly disposed inside the chip.

6. The adaptive voltage scaling circuit according to claim 1, wherein the comparison detection circuit comprises an exclusive OR gate logic circuit.

7. The adaptive voltage scaling circuit according to claim 1, wherein the source signal generating circuit comprises a flip-flop.

8. The adaptive voltage scaling circuit according to claim 1, wherein the comparison reference circuit comprises a flip-flop.

9. The adaptive voltage scaling circuit according to claim 1, wherein the at least one comparison branch circuit comprises a flip-flop.

10. The adaptive voltage scaling circuit according to claim 1, wherein the working performance of the chip at the current working voltage comprises: the current working voltage being excessively high, the current working voltage being excessively low, or the current working voltage suitable for normal working.

11. A chip, wherein the chip comprises an adaptive voltage scaling circuit, wherein the adaptive voltage scaling circuit comprises:
   a performance classification monitor disposed inside a chip and configured to detect working performance of the chip at a current working voltage; and
   an adaptive controller for receiving a detection result signal from the performance classification monitor;
   wherein the performance classification monitor comprises a source signal generating circuit, a comparison reference circuit, at least first and second delay circuits, at least first and second comparison branch circuits and at least first and second comparison detection circuits; and the adaptive controller comprises a configuration circuit;
   wherein an input end of the source signal generating circuit and first input ends of the comparison reference circuit, the first comparison branch circuit and the second comparison branch circuit each receives a clock signal as a drive;
   a first output end of the configuration circuit provides a first configuration signal connected to a first input end of the first delay circuit;
   a second output end of the configuration circuit provides a second configuration signal connected to a first input end of the second delay circuit;
   an output end of the source signal generating circuit configured to provide a source signal and connected to second input ends of the comparison reference circuit and the first and second delay circuits;
   an output end of the first delay circuit connected to a second input end of the first comparison branch circuit;
   an output end of the second delay circuit connected to a second input end of the second comparison branch circuit;
   an output end of the comparison reference circuit configured to provide a reference signal and connected to each of first input ends of the first comparison detection circuit and the second comparison detection circuit;
   an output end of the first comparison branch circuit connected to a second input end of the first comparison detection circuit, and
   an output end of the second comparison branch circuit connected to a second input end of the second comparison detection circuit; and
   each of an output ends of the first comparison detection circuit and the second comparison detection circuit connected to an input end of the control circuit and configured to provide the detection result signal.

12. The chip according to claim 11, wherein
the adaptive controller is connected to the performance classification monitor, and is configured to output a control signal to a power management module of the chip according to the detection result signal output by the performance classification monitor, wherein the control signal is used to control the power management module to adjust a working voltage of the chip; and
the source signal generating circuit is configured to provide the source signal for the performance classification monitor;
the comparison reference circuit is configured to output the reference signal according to the source signal;
the at least one delay circuit is configured to perform delay processing on the source signal to obtain a delayed source signal;
the at least one comparison branch circuit is configured to output a comparison signal according to the delayed source signal; and
the at least one comparison detection circuit is configured to output the detection result signal according to the reference signal and the comparison signal.

13. The chip according to claim 12, wherein the adaptive controller further comprises a control circuit, wherein
the configuration circuit is configured to generate the first configuration signal and the second configuration signal, wherein the first configuration signal and the second configuration signal are configured to set a delay chain of the performance classification monitor; and
the control circuit is configured to output the control signal to the power management module of the chip according to the detection result signal output by the performance classification monitor.

14. The chip according to claim 13, wherein the at least one delay circuit is a delay circuit, the at least one comparison branch circuit is a comparison branch circuit, and the at least one comparison detection circuit is a comparison detection circuit, wherein
an input end of the source signal generating circuit, a first input end of the comparison reference circuit, and a first input end of the comparison branch circuit separately receive a clock signal as a drive;
the configuration signal comprises a first configuration signal, and a first output end of the configuration circuit is connected to a first input end of the delay circuit and provides the first configuration signal;
an output end of the source signal generating circuit is configured to provide the source signal, and is separately connected to a second input end of the comparison reference circuit and a second input end of the delay circuit;
an output end of the delay circuit is connected to a second input end of the comparison branch circuit;
an output end of the comparison reference circuit is configured to provide the reference signal, and is connected to a first input end of the comparison detection circuit, and an output end of the comparison branch circuit is connected to a second input end of the comparison detection circuit; and an output end of the comparison detection circuit is connected to an input end of the control circuit, and is configured to provide the detection result signal.

15. The chip according to claim 11, wherein the adaptive voltage scaling circuit comprises the performance classification monitor among a plurality of performance classification monitors, and the plurality of performance classification monitors are evenly disposed inside the chip.

16. The chip according to claim 11, wherein the comparison detection circuit comprises an exclusive OR gate logic circuit.

17. The chip according to claim 11, wherein the source signal generating circuit comprises a flip-flop.

18. The chip according to claim 11, wherein the comparison reference circuit comprises a flip-flop.

19. The chip according to claim 11, wherein the at least one comparison branch circuit comprises a flip-flop.

20. The chip according to claim 11, wherein the working performance of the chip at the current working voltage comprises: the current working voltage being excessively high, the current working voltage being excessively low, or the current working voltage suitable for normal working.

* * * * *